(12) United States Patent
Inoue et al.

(10) Patent No.: US 7,897,025 B2
(45) Date of Patent: Mar. 1, 2011

(54) METHOD AND APPARATUS FOR FORMING THIN FILM

(75) Inventors: Kenichi Inoue, Kobe (JP); Hiroyuki Takamatsu, Kobe (JP); Takashi Kobori, Kobe (JP); Kazushi Hayashi, Kobe (JP); Toshihiro Kugimiya, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 1080 days.

(21) Appl. No.: 10/973,249

(22) Filed: Oct. 27, 2004

(65) Prior Publication Data

US 2005/0136694 A1 Jun. 23, 2005

(30) Foreign Application Priority Data

Oct. 29, 2003 (JP) .................................. 2003-369258

(51) Int. Cl.
*C23C 14/00* (2006.01)
(52) U.S. Cl. ........... 204/298.21; 204/298.23; 204/298.28
(58) Field of Classification Search ............. 204/208.11, 204/298.06, 298.21, 298.23, 298.28
See application file for complete search history.

(56) References Cited

U.S. PATENT DOCUMENTS

| | | | | |
|---|---|---|---|---|
| 5,320,984 A | * | 6/1994 | Zhang et al. ................... | 438/488 |
| 5,518,592 A | * | 5/1996 | Bower et al. ............. | 204/192.12 |
| 5,814,195 A | * | 9/1998 | Lehan et al. ............. | 204/192.12 |
| 2002/0092766 A1 | * | 7/2002 | Lampkin ................... | 204/298.22 |

FOREIGN PATENT DOCUMENTS

| | | | | |
|---|---|---|---|---|
| JP | 63290269 A | * | 11/1988 | |
| JP | 06306600 A | * | 11/1994 | |
| JP | 10-12572 | | 6/1996 | |
| JP | 10-140344 | | 11/1996 | |
| JP | 2001-140066 | | 11/1999 | |
| JP | 2002180256 A | * | 6/2002 | |

OTHER PUBLICATIONS

Machine Translation of JP 2002180256, Inoue et al., published Jun. 26, 2002.*

* cited by examiner

*Primary Examiner* — Nam X Nguyen
*Assistant Examiner* — John Brayton (57) ABSTRACT

A rotor having a cylindrical peripheral surface is disposed in a treatment vessel into which a carrier gas is introduced, and the rotor peripheral surface is opposed to the surface of a substrate with a predetermine gap therebetween. Film-forming particulates including atomic molecules of the film-forming material and cluster particulates thereof are scattered from the surface of the film-forming material supplying member by sputtering, and the rotor is rotated to form a carrier gas flow near the rotor peripheral surface. The film-forming particulates are transported to the vicinity of the surface of the substrate by the carrier gas flow and adhered to the surface of the substrate. As a result, the adverse effect of high-energy particles and the like is suppressed to efficiently form a satisfactory thin film by an evaporation or sputtering process, which has less restriction to a source material gas, without the need for large equipment.

18 Claims, 8 Drawing Sheets

METHOD AND APPARATUS FOR FORMING THIN FILM

BACKGROUND OF THE INVENTION

1. Field of the Invention

The present invention relates to a method and apparatus for forming a thin film on a surface of a substrate such as a glass substrate, a plastic substrate, or the like, the thin film comprising any of various materials such as metallic materials, semiconductor materials, insulating materials, and the like.

2. Description of the Related Art

A conventional technique widely known as a technique for forming a thin film on a surface of a substrate uses a sputtering phenomenon. This thin film forming technique is capable of forming films ranging from crystal films to amorphous films using almost all materials including metals, semiconductors, and insulators, and forming films of single elements, compounds, alloys, and the like. Thin film forming technique is also excellent in productivity, and thus widely used in various fields such as semiconductors, displays, surface processing, and the like.

In principle, sputtering is performed on the assumption that plasma is generated, and thus charged particles with relatively high energy, such as ions, electrons, and the like, and high-energy particles such as sputtered atoms are generated. By positively using such high energy, films with high mechanical strength such as adhesive force, and various functional thin films have been formed and brought into practical use. However, as studies progressed, it has become clear that in order to further improve the characteristics of a semiconductor such as GaAs, a functional material such as a high-temperature superconductor, for example, yttrium oxide, bismuth oxide, or the like, or an organic fluorescent material for organic EL, the energy of particles must be precisely controlled to remove particles having excessively high energy, thereby suppressing the adverse effect on film surfaces. On the other hand, a substrate on which a thin film is formed is exposed to high-energy particles and reaches a high temperature. Therefore, inorganic substrate are frequently used, and the application of sputtering to organic substrates for forming organic films, which easily change in quality and deteriorate due to high-energy particles, is limited to narrow ranges. For example, in multilayer wiring of a semiconductor device, only polyimide having relatively high durability is currently put into practical use for organic interlayer insulating films from the viewpoint described above.

Under these conditions, there have been active studies for controlling the energy of particles to further improve the performance of functional thin films and to extend the application of the sputtering technique to organic substrates. Examples of proposed methods include a method of applying a bias to a substrate to control the energy of charged particles, an off-axis sputtering method in which a substrate is separated from a sputtering space, and a method of optimizing the magnetic field strength of a sputtering cathode magnet to decrease a discharge voltage. Furthermore, methods capable of forming the above-described organic thin films include the following:

(1) The rate of occurrence of high-speed electrons and the energy of particles flying to a substrate are decreased by a DC sputtering method using Kr or Xe gas as a sputtering gas at an operating pressure of 10 Pa or more (Japanese Unexamined Patent Application Publication No. 10-12572).

(2) A coil made of the same material as a target material is disposed near a substrate, and an AC voltage is applied for converging electrons and ions in the vicinity of a surface of the target and for preventing incidence on the substrate (Japanese Unexamined Patent Application Publication No. 10-140344).

(3) A thin film forming method and apparatus using a transport sputtering process in which a substrate and a hollow target are disposed in a vacuum chamber, a high-speed sputtering gas is introduced from an end of the target to which a voltage is applied for generating a plasma, and the sputtered particles produced in the hollow portion of the target are transported by the sputtering gas and deposited on the substrate. Furthermore, an exhaust port is provided vertically to the central axis of the target, for exhausting the sputtering gas containing the sputtered particles. The substrate is disposed near the exhaust port apart from the central axis or within the exhaust port so that a thin film is formed while preventing the substrate from being influenced by plasma, high-energy particles, electromagnetic waves, and the like (Japanese Unexamined Patent Application Publication No. 2001-140066).

In the method and apparatus disclosed in each of the above documents, conditions for sufficiently removing high-energy particles such as electrons, ions and neutral particles, and electromagnetic waves emitted from the plasma, such as ultraviolet rays, are basically contrary to conditions for achieving mass productivity and increasing the area of a substrate surface on which a thin film formed. Therefore, it is very difficult to simultaneously satisfy these conditions. This problem is common to the sputtering method and a physical deposition method other than the sputtering method, for example, an evaporation method, to varying degrees.

Namely, in the existing evaporation method and sputtering method, evaporation, vaporization, or scattering of a film-forming material is isotropic and has no directivity. Thus, in order to avoid the influence of the high-energy particles and electromagnetic waves on the substrate surface during film deposition, an absolute distance or a blocking wall must be interposed between the substrate and a portion where the film-forming material is evaporated, vaporized, or scattered. As a result, the deposition rate is inevitably decreased.

Furthermore, in a reactor, many particulates adhere to a portion (for example, the inner wall of the reactor) other than the substrate. Therefore, the energy efficiency of the film-forming material is decreased, and the frequency of maintenance (cleaning) of the apparatus is increased, thereby causing difficulty in improving the working ratio.

The method disclosed in Japanese Unexamined Patent Application Publication No. 2001-140066 is the transport sputtering method in which the sputtered particles are transported from the sputtering region to the substrate using the high-speed gas and the hollow target, so that high-energy charged particles and neutral particles can be effectively removed before reaching the substrate. However, in order to actually optimize the arrangement of the target and the substrate, the flow rate of the transport gas, and the operating pressure, a flow rate of at least 50 m/s is required for forming a viscous flow for transporting a substance under a pressure (100 Pa or less) which allows sputtering due to the occurrence of the stable plasma. Since a giant exhaust system is required for securing such a high flow rate, practical application is difficult.

A thin film forming method other than the evaporation method and the sputtering method is a plasma chemical vapor deposition (CVD) method in which in principle, high-energy particles are not involved. However, in this CVD method, usable source material gases are greatly limited, and only amorphous Si, and oxide such as silica, titania, and the like are currently put into practical use. Although, in principle, a metal film can be formed using an organometallic vapor as a source material gas, many organometallic vapors have high toxicity and are hard to handle. Also, excessive investment is required for equipment for supplying and removing gases, and thus a CVD apparatus cannot be replaced by an existing evaporation apparatus or sputtering apparatus in the industrial field except for some extraordinary reason.

SUMMARY OF THE INVENTION

The present invention has been completed on the basis of the findings obtained in studies for solving the above-described problems of conventional methods. An object of the present invention is to provide a method and apparatus capable of effectively form a good thin film while suppressing the adverse effect of high-energy particles by an evaporation process or a sputtering process having less restriction to a source material gas without the need for large-scale equipment.

In order to solve the above problems, the present invention provides a method for forming a thin film on a substrate surface, the method comprising the steps of: rotating a rotor around the central axis of the cylindrical peripheral surface of the rotor, the rotor being disposed in a treatment vessel into which a carrier gas is introduced, and the cylindrical peripheral surface facing the substrate surface with a gap therebetween; supplying atomic molecules of the film-forming material and cluster particulates thereof to the cylindrical peripheral surface of the rotor by evaporating, vaporizing, or scattering a film-forming material in the surface of a film-forming material supplying member at a position circumferentially apart from the position where the cylindrical peripheral surface of the rotor faces the substrate surface in the treatment vessel, the surface of the film-forming material supplying member being composed of the film-forming material and facing the cylindrical peripheral surface of the rotor with a predetermined gap therebetween; transferring the substrate in substantially parallel with the circumferential rotational direction of the rotor at the position where the substrate faces the rotor; and transporting the atomic molecules and the cluster particulates thereof, which are supplied to the cylindrical peripheral surface of the rotor, by a flow of the carrier gas created by the rotor near the peripheral surface thereof, and adhering the atomic molecules and the cluster particulates thereof to the substrate surface to form a thin film composed of the film-forming material on the substrate surface.

The rotor may be not necessarily entirely received in the reactor. A portion of the rotor may be exposed to the outside of the reactor so that the exposed portion faces the substrate.

Unlike in a conventional method, in the above-described method, the atomic molecules of the film-forming material and the cluster particulates thereof (referred to as "film-forming particulates" hereinafter) are not isotropically evaporated or scattered, but the film-forming particulates are supplied to the peripheral surface of the rotor and transported to the vicinity of the substrate surface by the carrier gas flow created by the rotor near the peripheral surface thereof. Therefore, even if a large distance or a blocking wall is no interposed between the film-forming material supplying member and the substrate surface, the film-forming material can be concentrated and adhered to the substrate surface to form a thin film while effectively suppressing the influence of high-energy particles and electromagnetic waves, which are produced in evaporation or scattering of the film-forming material, on the substrate surface. Also, the amount of the film-forming particulates adhered to portions other than the substrate surface can be decreased to achieve a high energy efficiency and a high working ratio.

The step of evaporating, vaporizing, or scattering the film-forming material in the surface of the film-forming material supplying member preferably includes the step of heating the surface of the film-forming material supplying member to evaporate or vaporize the film-forming material in the surface, or the step of forming an electric field between the film-forming material supplying member and the rotor to generate a plasma of the carrier gas in the reactor, and sputtering the film-forming material in the surface of the film-forming material supplying member with ions contained in the plasma.

In either case, the film-forming particulates supplied to the peripheral surface of the rotor by heating or sputtering can be transported onto the substrate surface to form a satisfactory thin film while avoiding the substrate surface from being influenced by the high-energy particles and electromagnetic waves produced in heating or sputtering of the surface of the film-forming material supplying member at a position apart in the circumferential rotational direction of the rotor from the position where the substrate surface faces the peripheral surface of the rotor. When the evaporation or vaporization of the film-forming material by heating and the sputtering are simultaneously performed, a thin film can be more effectively formed.

Examples of effective means for thermally evaporating or vaporizing the film-forming material include means of burying a thin film heater below the surface layer of the film-forming material, means of disposing an electromagnetic induction coil adjacent to the film-forming material, and means of directly heating the surface of the film-forming material by an infrared lamp or a laser having an optical system for converging light on the surface.

Another applicable means for vaporizing the film-forming material is a laser abrasion method in which a pulse laser with high output is applied directly to the film-forming material to cause abrasion for emitting particles.

The step of sputtering the film-forming material in the surface of the film-forming material supplying member preferably comprises introducing a sputtering gas, which contains a rare gas element (for example, argon, xenon, or krypton when helium is used as the carrier gas) having a larger element number than that of the element of the carrier gas, into the gap between the film-forming material supplying member and the cylindrical peripheral surface of the rotor to produce ions of the rare gas element in the plasma produced in the gap, and sputtering the surface material of the film-forming material supplying member with the ions. According to this method, the film-forming material can be sputtered by collision of the ions of the rare gas element, and thus a large amount of the film-forming particulates can be scattered to the peripheral surface of the rotor with higher energy.

In the step of sputtering the film-forming material in the surface of the film-forming material supplying member, magnetic flux lines may be generated in the gap between the film-forming material supplying member and the rotor to enclose the plasma produced in the gap, thereby suppressing scattering of charged particles and permitting sputtering with high efficiency.

The film-forming material supplying member may be fixedly provided near the peripheral surface of the rotor. Alternatively, the film-forming material supplying member may be formed to have a cylindrical peripheral surface having a central axis parallel to the rotation central axis of the rotor, and rotated around the central axis in the direction opposite to the rotational direction of the rotor. In this case, the film-forming material can be supplied while suppressing disturbance of the carrier gas flow created by the rotor near the peripheral surface thereof at the position where the rotor faces the film-forming material supplying member.

In the method of the present invention, the carrier gas is preferably a relatively light rare gas with a metastable state level, for example, helium, neon, argon, or a gas mixture thereof. By using such as carrier gas, the occurrence of the plasma can be stabilized, and the particulates produced by evaporation or vaporization of the film-forming material can be transported while being covered with radicals of the carrier gas. As a result, an adhesive force for forming a film can be increased.

When helium gas is used as the carrier gas, in order to securely form a viscous and laminar flow of the helium gas, an operation may be performed in such a manner that the pressure P [Pa] of the helium gas, the dimension g [m] between the film-forming material supplying member and the rotor, and the circumferential speed u [m/s] of the rotor satisfy the conditional relation $10^{-5} << P \cdot g < 10^4/u$.

The present invention also provides an apparatus for forming a thin film on a substrate, the apparatus comprising: a treatment vessel into which a carrier gas is introduced; a rotor disposed in the treatment vessel and having a cylindrical peripheral surface which faces a surface of the substrate with a gap therebetween, the substrate being introduced into the treatment vessel; rotational driving means for rotating the rotor around the central axis of the cylindrical peripheral surface; a film-forming material supplying member disposed in the treatment vessel to face the cylindrical peripheral surface of the rotor at a position circumferentially apart from the position where the cylindrical peripheral surface of the rotor faces the substrate surface, at least the surface facing the cylindrical peripheral surface being composed of a film-forming material; and film-forming material supplying means for supplying atomic molecules of the film-forming material and cluster particulates thereof to the cylindrical peripheral surface of the rotor by evaporating, vaporizing, or scattering the film-forming material of the film-forming material supplying member. In the apparatus, the atomic molecules and the cluster particulates thereof supplied to the cylindrical peripheral surface of the rotor are transported to the vicinity of the substrate surface by a carrier gas flow created by the rotor near the peripheral surface thereof and adhered to the substrate surface to form a thin film composed of the film-forming material on the substrate surface.

The film-forming material supplying means preferably comprises a heating means for heating the surface of the film-forming material supplying member to evaporate or vaporize the film-forming material in the surface, or plasma generating means for forming a DC electric field, a high-frequency electric field, or an AC electric field other than the high-frequency electric field between the film-forming material supplying member and the rotor to generate a plasma of the carrier gas in the reactor, so that the film-forming material in the surface of the film-forming material supplying member is sputtered by ions in the plasma.

The heating means is preferably incorporated into the film-forming material supplying means so as to be positioned near the inner side of the surface composed of the film-forming material. In this structure, the film-forming material in the surface of the film-forming material supplying member can be effectively evaporated or vaporized by heating with the heating means incorporated into the film-forming material supplying means while maintaining a simple structure.

When sputtering is performed by the plasma generating means, a sputtering gas supplying part is provided for introducing the rare gas element having a larger element number than that of the constituent element of the carrier gas into the gap between the film-forming material supplying member and the cylindrical peripheral surface of the rotor, and ions of the rare gas element supplied from the sputtering gas supplying part are produced in the plasma so that the surface material of the film-forming material supplying member is sputtered with the ions. In this case, the film-forming material can be more efficiently scattered.

Furthermore, magnetic flux forming means may be provided for producing magnetic flux lines in the gap between the film-forming material supplying member and the rotor, and enclosing the plasma produced in the gap. In this case, sputtering can be performed with higher efficiency while suppressing scattering of charged particles.

In this case, when a magnet is incorporated into a support member for supporting the film-forming material supplying member, for generating the magnetic flux lines, magnetic flux forming means capable of forming effective magnetic flux lines in a simple structure can be formed.

When the film-forming material supplying member has a cylindrical peripheral surface having a central axis parallel to the rotation central axis of the rotor, supplying member driving means is preferably provided for rotating the film-forming material supplying member in the direction opposite to the rotational direction of the rotor. In this case, the film-forming material can be supplied while suppressing disturbance of the carrier gas flow created by the rotor near the peripheral surface thereof at the position where the rotor faces the film-forming material supplying member.

The gap between the substrate surface and the peripheral surface of the rotor is preferably as small as possible. This is because when the passage of the carrier gas through the gap is suppressed to turn most of the carrier gas in front of the gap, the film-forming particulates (the atomic molecules of the film-forming material and the cluster particulates thereof) contained in the carrier gas can be separated from the carrier gas by the centrifugal force exerted on the film-forming particulates, and effectively adhered to the surface of the substrate.

Specifically, the gap between the substrate surface and the peripheral surface of the rotor is more preferably smaller than the gap between the peripheral surface of the rotor and the film-forming material supplying member.

The apparatus of the present invention more preferably further comprises a carrier gas circulating path for circulating the carrier gas in the reactor so that the carrier gas on the upstream side in the rotational direction of the rotor from the film-forming material supplying member is supplied from the downstream side in the rotational direction of the rotor from the position where the rotor faces the substrate. By providing the path, a viscous flow of the carrier gas in the reactor can be further smoothed (specifically, a turbulent flow can be suppressed to promote laminarization).

In this case, an adsorption pump is provided at an intermediate position of the carrier gas circulating path, for removing, by adsorption, at least one of the gases contained in the carrier gas flowing in the path, i.e., the impurity gas discharged through the inner wall of the reactor, the sputtering gas remaining in the reactor, and the secondary unnecessary organic gas vaporized from the film-forming material. This is because the gases in the reactor can be purified by the carrier gas circulating path to improve film quality.

The reactor further comprises an exhaust part for exhausting, to the outside of the reactor, the atomic molecules of the film-forming material and the cluster particulates thereof, which remain unadhered to the surface of the substrate on the upstream side in the rotational direction of the rotor from the position where the rotor faces the substrate. In this case, the atomic molecules and the cluster particulates of the film-forming material, which remains unadhered to the surface of the substrate, can be positively exhausted to promote purification of the interior of the reactor. As a result, the frequency of maintenance such as cleaning of the inside of the apparatus can be decreased to further improve the working ratio and facilitate continuous film deposition.

As described above, in the present invention, the film-forming material is evaporated from the surface of the film-forming material supplying member which faces the rotor at a position apart in the circumferential rotational direction of the rotor from the position where the rotor faces the substrate, and the film-forming particulates are supplied to the peripheral surface of the rotor, transported to the vicinity of the substrate surface by the carrier gas flow created by the rotor near the peripheral surface thereof, and adhered to the substrate surface. Therefore, the substrate surface can be effectively prevented from being influenced by incidence of the high-energy particles produced in the evaporation process or sputtering process, and thus the formation of a satisfactory thin film can be realized without the need for large-scale equipment.

Furthermore, the film-forming material can be concentrated and adhered to the substrate surface, and adhesion to other portions (for example, the inner wall of the reactor) can be effectively suppressed, thereby significantly improving the working ratio and mass productivity.

DETAILED DESCRIPTION OF THE PREFERRED EMBODIMENTS

Preferred embodiments of the present invention will be described with reference to the drawings.

Figure 1:
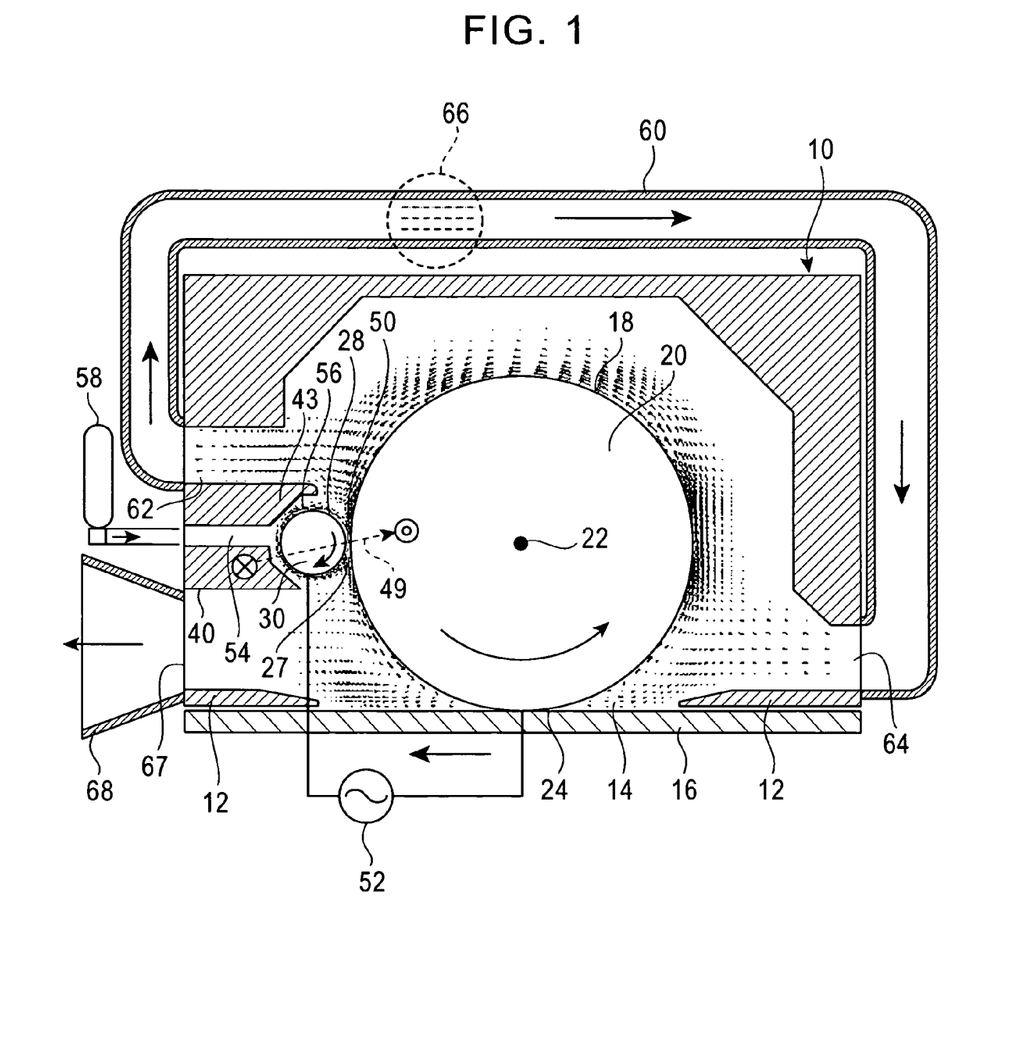
FIG. 1 is a sectional front view showing the entire configuration of a thin film forming apparatus according to an embodiment of the present invention.
Figure 2A:
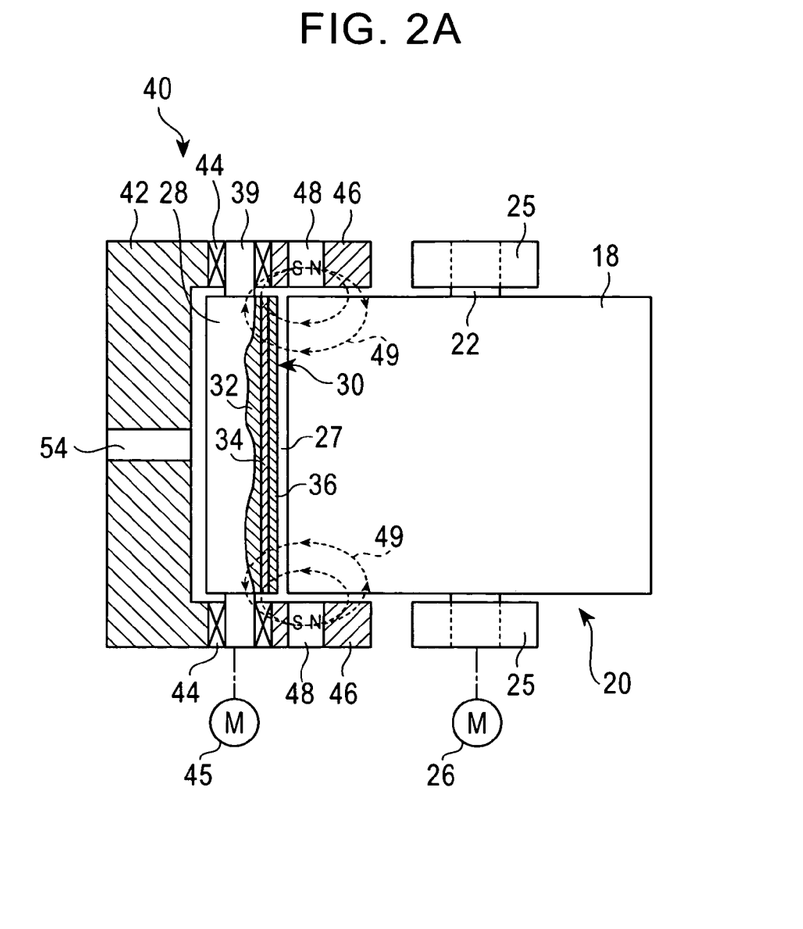
FIG. 2(a) is a plan view showing a rotor, a film-forming material supplying member, and a support structure thereof in the thin film forming apparatus, and FIG. 2(b) a sectional view showing the layered structure of the film-forming material supplying member.
Figure 2B:
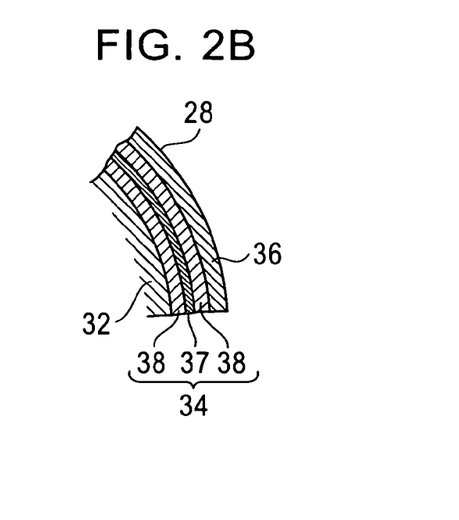

The thin film forming apparatus shown in FIGS. 1 and 2 comprises a reactor 10 into which a carrier gas (in this embodiment, helium gas) is introduced. The bottom wall 12 of the reactor 10 also functions as a current plate for the helium gas. The bottom wall 12 has an opening 14 formed at the center thereof. A substrate 16 is transferred horizontally to pass directly below the opening 14.

In the present invention, the shape of the substrate 16 and the means for transferring the substrate 16 are not limited. For example, when the substrate 16 is a glass substrate, a table having the substrate 16 mounted thereon can be transferred. When the substrate 16 is an elongated plastic film, an end of the film wound on a feed roller can be rewound by a take-up roller disposed apart from the feed roller so that the film can be transferred to pass directly below the opening 14.

Also, the transfer direction of the substrate 16 is not limited as long as it is substantially parallel to the circumferential rotational direction of the rotor 20 at the position where the substrate 16 faces a rotor 20 which will be described above. The substrate 16 may be transferred in the direction shown by an arrow in FIG. 1 or the direction opposite to the arrow direction, or reciprocated in both directions.

In the reactor 10, the rotor 20 having a cylindrical peripheral surface 18 is provided. The rotor 20 has a rotation central axis 22 coinciding with the central axis of the cylindrical peripheral surface 18, and is disposed in such a manner that the rotation central axis 22 is in a horizontal direction, and only the bottom of the rotor 20 slightly projects downward from the reactor bottom wall 12 through the opening 14. At the bottom of the rotor 20, a small gap 24 (preferably about 1 to 3 mm) is formed between the peripheral surface 18 and the substrate 16. Both ends of the rotation central axis 22 are rotatably supported by a bearing stand 25, as shown in FIG. 2(a). Furthermore, the output shaft of a motor (rotational driving means) 26 is connected to the rotation central axis 22. The rotor 20 is rotated (preferably driven at a rotational speed of 100 rpm or more) in the counterclockwise direction in FIG. 1 (the arrow direction shown in the drawing) by operating the motor 26.

The rotor 20 may be completely received in the reactor 10. In this case, the substrate 16 may be transferred into the reactor 10.

Furthermore, a film-forming material supplying member 30 is provided in the reactor 10, the film-forming material supplying member 30 having a cylindrical peripheral surface 28 with a smaller diameter than that of the cylindrical peripheral surface 18.

The film-forming material supplying member 30 is adapted for supplying film-forming particulates (atomic molecules of a film-forming material and cluster particulates thereof) to the peripheral surface 18 of the rotor 20. As shown in FIGS. 2(a) and 2(b), the film-forming material supplying member 30 comprises a cylindrical body 32 on the surface of which a heating layer 34 and a film-forming material layer 36 are laminated in turn.

The film-forming material layer 36 comprises a film-forming material (for example, aluminum) so that the material is evaporated or vaporized by heating with the heating layer (heating means) 34 disposed directly inside of the material. The heating layer 34 comprises a heating high-resistance layer 37, and insulating layers 38 holding the heating high-resistance layer 37 therebetween, and heat is generated by supplying a current to the high-resistance layer 37 from a power supply not shown in the drawings.

The film-forming material supplying member 30 has a rotation central axis 39 coinciding with the central axis of the cylindrical peripheral surface 28. The film-forming material supplying member 30 is disposed in such a manner that the rotation central axis 39 is parallel to the rotation central axis 22 of the rotor 20, and the member 30 faces the peripheral surface 18 of the rotor 20 at a position a predetermined angle (in FIG. 1, 90°) apart in the circumferential direction from the position where the peripheral surface 18 of the rotor 20 faces the surface of the substrate 16.

The rotation central axis 39 is rotatably supported on the side wall of the reactor 10 by a support member 40. The support member 40 comprises a support member body 42 formed integrally with the side wall of the reactor 10, and bearings 44 projecting from the front and rear ends of the support member body 42 toward the rotor 20. The ends of the rotation central axis 39 are rotatably supported by the respective bearings 44.

Furthermore, the output shaft of a motor (supply member driving means) 45 is connected to the rotation central axis 39. By operating the motor 45, the film-forming material supplying member 30 is rotated in the direction (the arrow direction in FIG. 1) opposite to the rotational direction of the rotor 20 at a predetermined rotational speed (preferably substantially equal to the circumferential speed of the rotor 20).

This apparatus further comprises plasma generating means for generating a plasma 50 of the carrier gas between the rotor 20 and the film-forming material supplying member 30. Specifically, a high-frequency power supply 52 (for example, 13.56 MHz) is disposed between the rotor 20 and the film-forming material supplying member 30 both of which are used as electrodes. Therefore, an electric field is formed in the gap 27 between the peripheral surface 18 of the rotor 20 and the peripheral surface of the film-forming material supplying member 30 by high-frequency power of the high-frequency power supply 52, thereby forming the plasma 50 of the carrier gas. In the present invention, a DC power supply or an AC power supply other than the high-frequency power supply may be used instead of the high-frequency power supply.

On the other hand, the support member body 42 includes a sputtering gas supply part. The sputtering gas supply part supplies a sputtering gas to the gap 27 between the rotor 20 and the film-forming material supplying member 30, the sputtering gas comprising a rare gas (for example, Ar or Xe) having a lager element number than that of the carrier gas (He) (preferably larger than that of the film-forming material (Al)).

The sputtering gas supply part comprises a gas inlet 54 formed at the center of the support member body 42 to pass through the reactor side wall, and a gas passage 56 opening toward the rotor 20 and extending from the gas inlet 54 along the peripheral surface of the film-forming material supplying member 30 to. The gas passage 56 is formed between a film-forming material supplying member cover 43 formed on the support member body 42 and the peripheral surface 28 of the film-forming material supplying member 30. The gas inlet 54 is connected to a gas cylinder 58 in which the sputtering gas is sealed under high pressure. The sputtering gas is supplied to the gap 27 between the peripheral surface 28 of the film-forming material supplying member 30 and the rotor peripheral surface 18 along the peripheral surface 28 from the gas cylinder 58 through a sputtering gas supply nozzle.

Also, in the support member 40, magnetic flux lines 49 are formed in the gap 27 between the film-forming material supplying member 30 and the rotor 20 to enclose the plasma 50 produced in the gap 27, thereby suppressing scattering of charged particles. Namely, magnetic flux forming means is provided.

Specifically, in the magnetic flux forming means, magnetic flux forming members 46 are provided to extend from both bearings 44 toward the rotor 20 and cover the outer surfaces of both sides of the rotor 20, and magnets 48 are incorporated in the respective magnetic flux forming member 46. The magnets 48 are arranged so that the NS poles are arranged in the longitudinal direction of the magnetic field forming means 46. The bearings 44 and the magnetic flux forming members 46 are made of a magnetic material such as iron, or the like, and the support member body 42 is made of a nonmagnetic material such as stainless steel or the like. The magnetic flux lines 49 formed due to the presence of the magnets 48 pass through the gap 27 in the direction in which the rotor 20 faces the film-forming material supplying member 30.

The apparatus further comprises a carrier gas circulating path 60 for circulating the carrier gas in the reactor 10. The carrier gas circulating path 60 comprises a gas inlet part 62 provided on the upstream side (the upper side in the drawing) in the rotational direction of the rotor 20 from the film-forming material supplying member 30 in the reactor 10, and a gas exhaust part 64 disposed on the downstream side in the rotational direction of the rotor from the position where the rotor 30 faces the surface of the substrate 16. Also, the carrier gas circulating path 60 is disposed around the reactor 10 so that both parts 62 and 64 communicate with each other.

Furthermore, the carrier gas circulating path 60 comprises an adsorption pump (adsorption means) 66 for removing, by adsorption, at least one (preferably all) of the gases contained in the carrier gas flowing through the path, i.e., the impurity gas discharged through the inner wall of the reactor 10, the sputtering gas remaining in the reactor 10, and the secondary unnecessary organic gas evaporated from the film-forming material. As the adsorption pump 66, for example, a cryosorption pump or a physisorption pump can be used.

The reactor 10 comprises an exhaust port 67 opening to the region between the position where the rotor 20 faces the film-forming material supplying member 30 and the position where the rotor 30 faces the substrate 16. An exhaust duct 68 is connected to the exhaust port 67.

Next, a method for forming a thin film using the above-described apparatus will be described.

In the reactor 10, when the rotor 20 is rotated in the arrow direction shown in FIG. 1, the carrier gas (in this embodiment, helium gas) in the periphery of the rotor 20 flows along the rotor peripheral surface 18 to form a gas flow which passes through the gap 27 between the peripheral surface 18 and the peripheral surface 28 of the film-forming material supplying member 30, and which is directed toward the gap 24 between the rotor peripheral surface 18 and the substrate 16. In particular, when the film-forming material supplying member 30 having the cylindrical peripheral surface 28 is also rotated in the direction opposite to the rotational direction of the rotor 20, as shown in the drawing, the flow in the gap 27 is further smoothed.

However, the gist of the present invention includes an embodiment in which the film-forming material supplying member 30 is fixedly disposed without being rotated.

On the other hand, the high-frequency power is applied to the gap between the rotor 20 and the film-forming material supplying member 30 from the high-frequency power supply 52, and thus the plasma 50 is formed in the gap 27. Also, the sputtering gas is supplied into the plasma 50 through the gas inlet 54 and the gas passage 56 to form ions of the rare gas constituent element of the sputtering gas. Therefore, the film-forming material layer 36 in the surface of the film-forming material supplying member 30 is sputtered by collision of the ions, and thus the film-forming particulates (atomic molecules of the film-forming material and cluster particulates thereof) are effectively scattered to the gap 27.

In particular, in the apparatus shown in the drawings, the magnetic flux lines 49 are formed by the magnets 48 incorporated into the support member 40, for enclosing the plasma 50 in the gap 27. As a result, discharge can be further stabilized, and scattering of the charged particles to the substrate 16 can be suppressed.

In the apparatus, along with the sputtering, a current is supplied to the high-resistance layer 37 of the heating layer 34 in the film-forming material supplying member 30 to heat the film-forming material layer 36, and thus the film-forming particulates are supplied to the gap 27 from the film-forming material layer 36 by evaporation or vaporization.

The present invention includes an embodiment in which the film-forming particulates are produced by only one of the sputtering and the heating. Even when the heating means is used, it is effective to provide an electromagnetic induction coil near the film-forming material supplying member 30, or heat the surface of the film-forming material supplying member 30 directly with an infrared lamp or a laser having an optical system for converging light on the surface instead of providing the heating layer 34 in the film-forming material supplying member 30, as shown in FIG. 1. By using such an evaporation method, the present invention permits the deposition of existing organic fluorescent materials. When only the heating means is used, the surface shape of the film-forming material supplying member 30 may be not necessarily convex, and for example, the surface shape may be concave or planar along the peripheral surface 18 of the rotor 20.

In the apparatus shown in FIG. 1, the film-forming particulates produced as described above are transported to the gap 24 between the substrate 16 and the rotor 20 by a viscous flow of the carrier gas produced near the peripheral surface 18 of the rotor 20, and then adhered to the surface of the substrate 16, which is transferred horizontally, to form a thin film. The mechanism are shown in FIGS. 3 and 4(a) and 4(b).

Figure 3:
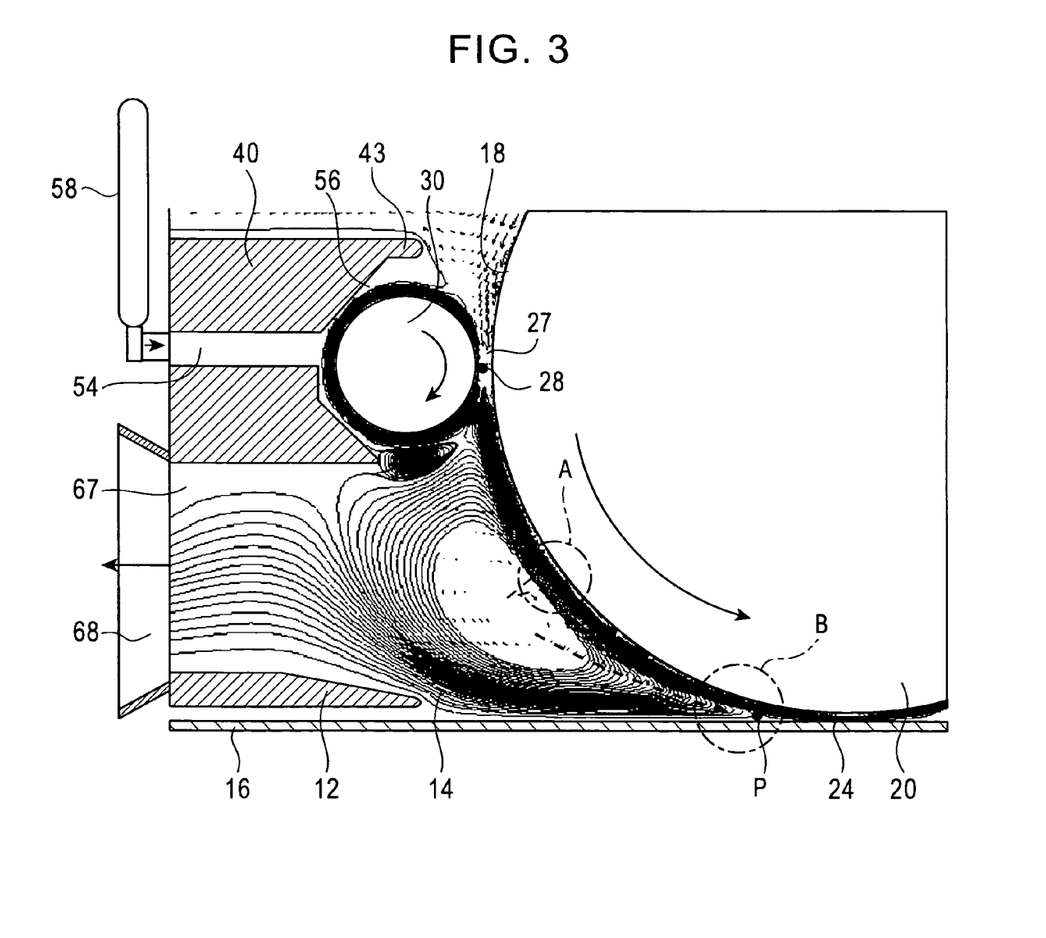
FIG. 3 is a sectional view showing the flow state of a carrier gas in a principal portion of the thin film forming apparatus.

FIG. 3 shows the analysis results of a fluid in the region extending from the film-forming material supplying member 30 to the substrate 16, i.e., a flow rate distribution and flow lines (loci of virtual particulates with zero mass and zero diameter) produced in the gap 27 between the film-forming material supplying member 30 and the rotor 20. In the drawing, the flow lines can be approximately regarded as loci of the helium molecules of the carrier gas. Although most of the carrier gas flowing out of the gap 27 flows along the circumference of the rotor 20, the carrier gas turns in front of the gap 24 between the rotor 20 and the substrate 16 because of great flow resistance, and then flows along the surface of the substrate 16. About half of the carrier gas again flows toward the rotor 20 to form an eddy, and the remaining half is exhausted to the outside of the reactor through the exhaust port 67.

Figure 4A:
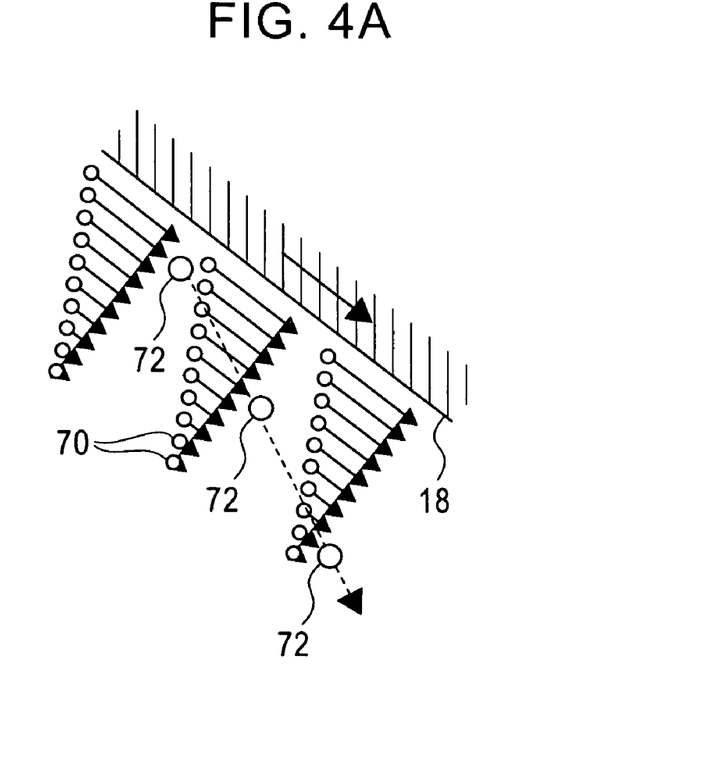
FIG. 4(a) is a drawing illustrating a flow rate gradient of helium gas in portion A near the peripheral surface of the rotor shown in FIG. 3.
Figure 4B:
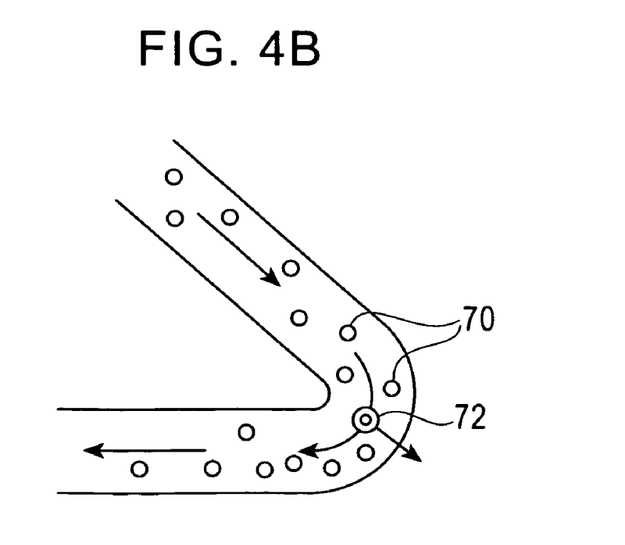
FIG. 4(b) is a drawing illustrating a centrifugal force exerted on film-forming particulates of a film-forming material at a stagnation point in portion B near the surface of the substrate shown in FIG. 3.

FIGS. 4(a) and (b) show a flow model in which film-forming particulates 72 having a higher specific gravity than that of carrier gas molecules 70 are mixed in the carrier gas having a lower specific gravity. As shown in FIG. 4(a), a steep flow rate gradient is produced near the surface of the rotor 20, and the flow path of the film-forming particulates 72 having a higher specific gravity moves from the vicinity of the rotor peripheral surface 18 to the outer side with a lower flow rate due to a stochastic transport phenomenon. Namely, the particulates 72 gradually separate from the rotor peripheral surface 18 to the outer side in the radial direction. Furthermore, as show in FIG. 4(b), the flow lines abruptly turn back in front of the gap 24 between the substrate 16 and the rotor 20, and thus larger centrifugal force F is exerted on the film-forming particulates 72 having a higher specific gravity, as compared with the carrier gas molecules 70.

The centrifugal force F/m per part mass, i.e., a centrifugal acceleration $\alpha$ [m/s$^2$], can be estimated by the equation $\alpha = U^2/r$ wherein U is a flow rate [m/s], and r is the radius of curvature in the vicinity of the top of a flow line.

Assuming that the flow rate U is considered to be equal to the circumferential speed of the rotor 20, the diameter of the rotor 20 is 0.1 m$\phi$ (specification for a relatively small experimental machine), and the rotational speed is 300 rpm, the flow rate is as follows:

$$U = 0.1 \text{ m}\phi \times \Pi \times 300 \text{ rpm} \div 60 \text{ s/min} = 1.5 \text{ m/s}$$

When r≠0.001 m based on the analysis results of a fluid is applied, the centrifugal acceleration $\alpha$ is as follows:

$$\alpha = (1.5 \text{ m/s})^2 / 0.001 \text{ m} = 2,250 \text{ [m/s}^2\text{]}$$

Assuming that the acceleration of gravity on the ground is 9.8 m/s$^2$, it can be understood that the centrifugal acceleration $\alpha$ is $\alpha \approx 200$ G and significantly exceeds the acceleration of gravity (30 G) on the surface of the sun.

In the present invention, it is important that a stagnation point P with zero flow rate is produced near the turn-around point (accurately the surface line of the substrate 16) of the flow lines. The flying film-forming particulates 72 of a nano-size are centrifuged with the great acceleration $\alpha$ exerted on the flow lines adjacent to the stagnation P, settle near the stagnation point P, and adhere to the surface of the substrate 16. Therefore, during the above-described operation, the substrate 16 is transferred in the direction (the arrow direction shown in FIG. 1) perpendicular to the rotation central axis 22 of the rotor 20 to deposit a film on the substrate 16.

The method and apparatus of the present invention are basically characterized in that most of the nano-sized film-forming particulates produced in the gap 27 between the film-forming material supplying member 30 and the rotor 20 can be transported to the stagnation point P by the carrier gas viscous flow near the rotor peripheral surface 18. This corresponds to the function that light of a light source disposed at one of the focal points of an elliptical mirror is entirely converged to the other focal point. Therefore, the characteristic greatly contributes to an increase in the energy efficiency of the film-forming material and improvement in working ratio due to a decrease in the frequency of maintenance (cleaning) of an industrial production apparatus.

In the present invention, the carrier gas is not limited to helium gas, and other rare gases (for example, neon and argon) can be used. When helium gas is used as the carrier gas, various significant effects can be obtained by utilizing the properties of helium gas, for example, the long life of a metastable state (level).

Figure 5A:
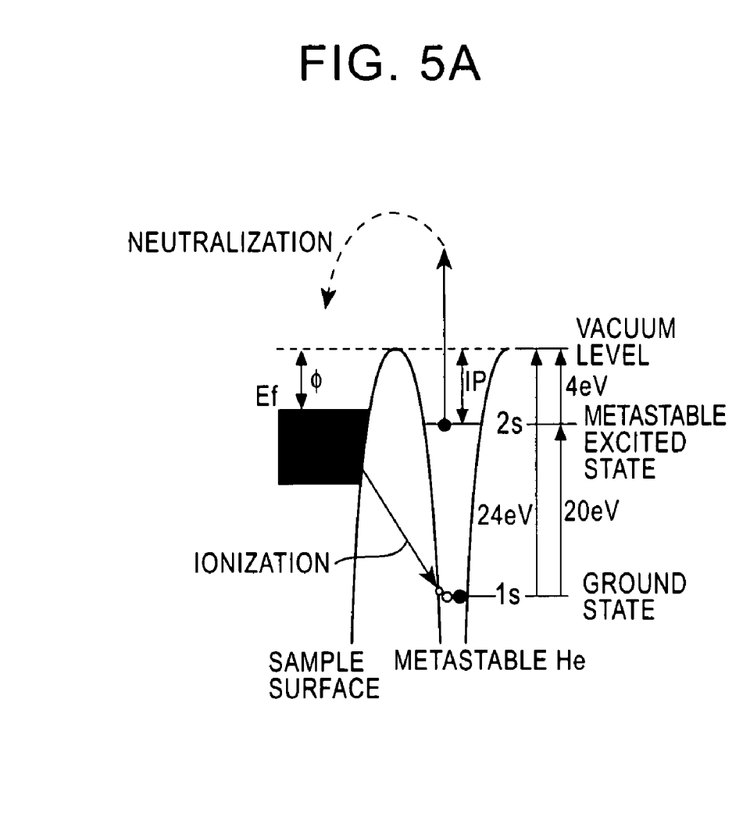
FIG. 5(a) is a conceptual view showing the metastable state of helium and a Penning ionization action with a solid surface.

A well-known effect of helium gas is that plasma discharge can be relatively easily performed whereas the ionization energy is as high as 24 eV. This is due to the fact that helium can be stayed in a metastable state with an energy of as high as about 20 eV for a long time in a plasma chamber. Namely, helium has the property that ionized helium remains in the metastable state without returning to a ground state even when being recombined with electrons, and the ionized helium is then ionized with an energy of as low as 4 eV (=24 eV−20 eV) (refer to FIG. 5(a)). When such helium gas is used as the carrier gas, a large amount of helium in the metastable excited state (radical) is present in the plasma 50 produced in the gap 27 between the rotor 20 and the film-forming material supplying member 30, and the radical helium circulates along the rotor peripheral surface 18 and again returns to the gap 27. Therefore, even at a relatively high pressure close to atmospheric pressure, stable plasma discharge can be easily realized.

The use of helium gas further causes the following effects:

In the present invention, the film-forming particulates transported by the carrier gas are thermalized during transportation (i.e., the film-forming particulates lose momentum in the direction of movement due to repeated collision between the gas molecules and the high-speed film-forming particulates) to lose kinetic energy, and high-speed particles are removed due to the loss of kinetic energy (i.e., high-speed particles lose kinetic energy to cause thermal kinetic energy corresponding to the temperature of the surrounding carrier gas) to produce the effect of effectively preventing damage to the surface of the substrate 16. However, instead, it is difficult to expect the effects of the kinetic energy in an ordinary sputtering process, i.e., the effect of clarifying (removing adsorbed impurities) the surface of the substrate by the kinetic energy of the sputtered particles, and the effect of cutting chemical bonds on the substrate surface to improve adhesion. However, when helium gas having a long-lived metastable state is used as the carrier gas, as described above, the properties of helium gas can be utilized for compensating for these effects.

Figure 5B:
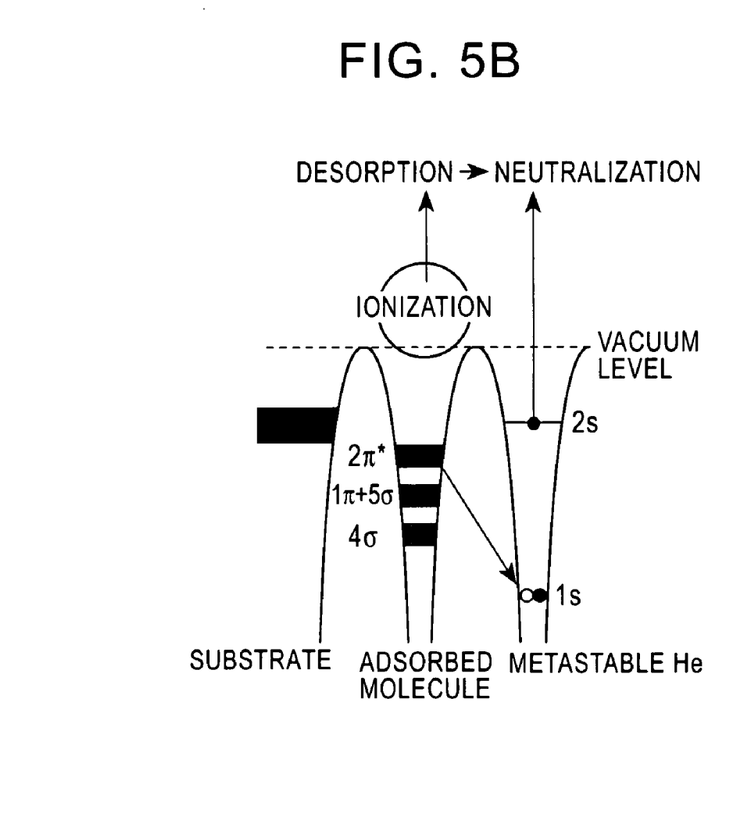
FIG. 5(b) is a conceptual view showing an interaction between a solid surface and an admolecule.

Namely, when helium radical collides with other molecules, the other molecules can be ionized with the high energy of the helium gas. Therefore, when the helium radical reaches the surface of the substrate 16, chemical bonds of atoms on the surface are cut by a phenomenon referred to as a "Penning process" shown in FIG. 5(a). As a result, the reactivity of the surface is increased to create a state in which the flying film-forming particulates easily adhere to the surface. It is also possible to achieve a cleaning effect that removal of the impurity molecules adsorbed on the substrate surface can be promoted by ionization, as shown in FIG. 5(b). The nano-sided particulates have higher surface energy than that of ordinary macro substances, and recrystallized to any form (including amorphous) only by settling. However, the recrystallization is inhibited by mixing with impurity molecules. The influence of the impurity molecules can be weakened by the helium radical to promote the recrystallization.

The metastable state is present not only in helium but also in neon and argon (refer to Table 1).

TABLE 1

| Metastable excited state | | Level E* (eV) | Life T (sec) |
|---|---|---|---|
| He* | $2^1S$ | 20.616 | $3.8 \times 10^{-2}$ |
|  | $2^3S$ | 19.820 | $4.2 \times 10^3$ |
| Ne* | $^3P_0$ | 16.716 | $4.3 \times 10^2$ |
|  | $^3P_2$ | 16.619 | $2.4 \times 10^1$ |
| Ar* | $^3P_0$ | 11.723 | $4.5 \times 10^1$ |
|  | $^3P_2$ | 11.548 | $5.6 \times 10^1$ |

In the present invention, as described above, the film-forming particulates are transported by a viscous flow of the carrier gas, and thus the operating conditions are preferably determined to produce the laminar and viscous flow near the peripheral surface 18 of the rotor 20.

A condition for the laminar flow is a Reynolds number Re of a predetermined value or less. When Re is considered as 1000 or less in consideration of the condition that a rare gas such as neon, argon, or the like is present, the condition for the laminar flow is represented by the following equation:

$$Re = U \cdot L / \nu < 1000 \quad (1)$$

wherein U denotes a representative flow rate, L denotes a representative dimension, ν denotes a coefficient of kinetic viscosity (=η/ρ: η is a coefficient of viscosity, and ρ is a density).

When the density of helium $\rho = 0.18 \times 10^{-5} \times P [kg/m^3]$ (wherein P [Pa] is the pressure of the carrier gas), and the coefficient of viscosity $\eta = 20 \times 10^{-6}$ [poise] (constant regardless of pressure) are substituted into the above equation, the following equation (2) is obtained:

$$P \cdot U \cdot L < 10000 \quad (2)$$

When the circumferential speed u [m/s] of the rotor 20 is substituted for the representative speed U, and the dimension g [m] of the gap 27 between the film-forming material supplying member 30 and the rotor 20 is substituted for the representative dimension L, the equation (2) is converted to the following equation (3):

$$P \cdot g < 10^4 / U \quad (3)$$

On the other hand, a condition for the viscous gas flow, not for a molecular flow under vacuum, is that the mean free path λ [m] of helium and a representative length g [m] must satisfy the following relationship:

$$\lambda \ll g \quad (4)$$

Since the mean free path λ of helium is represented by the function of pressure P [Pa], $\lambda = 1.4 \times 10^{-6}/P$, this function is substituted into the equation (4). Furthermore, when a safety side not including a region of transition from the molecular flow to the viscous flow is taken into consideration, the following equation (5) is obtained:

$$10^{-5} \ll P \cdot g \quad (5)$$

When the equation (5) is combined with the equation (3), the following equation (6) is obtained as an equation expressing an operating condition:

$$10^{-5} \ll P \cdot g < 10^4 / u \quad (6)$$

In the present invention, the flow behaviors of the film-forming particulates and the sputtering gas are important, and various means are preferably taken for creating a safe viscous flow even in the small reactor 10 while avoiding the occurrence of a local, unexpected turbulent flow. From this viewpoint, the apparatus shown in the drawings comprises the carrier gas circulating path 60 added to the reactor 10 so that the carrier gas on the upstream side in the rotational direction of the rotor 20 from the film-forming material supplying member 30 is supplied, by the path 60, from the downstream side in the rotational direction of the rotor 20 from the position where the rotor 20 faces the substrate 16. Therefore, the viscous flow of the carrier gas can be further smoothed to promote laminarization.

It is also effective that the inner surface of the reactor 10 is formed in the shape shown in FIG. 1 along the desired flow form.

The reactor 10 shown in FIG. 1 further comprises the exhaust port 67 and the exhaust dust 68. Therefore, the film-forming particulates remaining unadhered to the surface of the substrate 16 on the upstream side in the rotational direction of the rotor 20 from the position where the rotor 20 faces the substrate 16 can be discharged to the outside of the reactor through the exhaust port 67. As a result, the inside of the reactor 10 can be kept clean, for permitting continuous deposition. In particular, in an industrial apparatus, the interval of maintenance such as cleaning of the inside of the apparatus can be increased.

Furthermore, the adsorption pump 66 is provided at an intermediate position of the carrier gas circulating path 60.

Therefore, the impurity gas discharged through the inner wall of the reactor, the sputtering gas remaining in the reactor, and the secondary unnecessary organic gas vaporized from the film-forming material can be removed by the adsorption pump 66, thereby maintaining the carrier gas in the reactor 1 clean over a longer period of time.

For example, when a cryopump is used as the adsorption pump 66, helium cannot be condensed by the pump at an ordinary operation temperature. Therefore, when helium gas is used as the carrier gas, only impurities contained in the carrier gas can be selectively adsorbed.

When the temperature is increased under control during maintenance of the apparatus, a system capable of recovering Ar and expensive Xe used as the sputtering gas can be realized by the presence of the adsorption pump 66.

Figure 6:
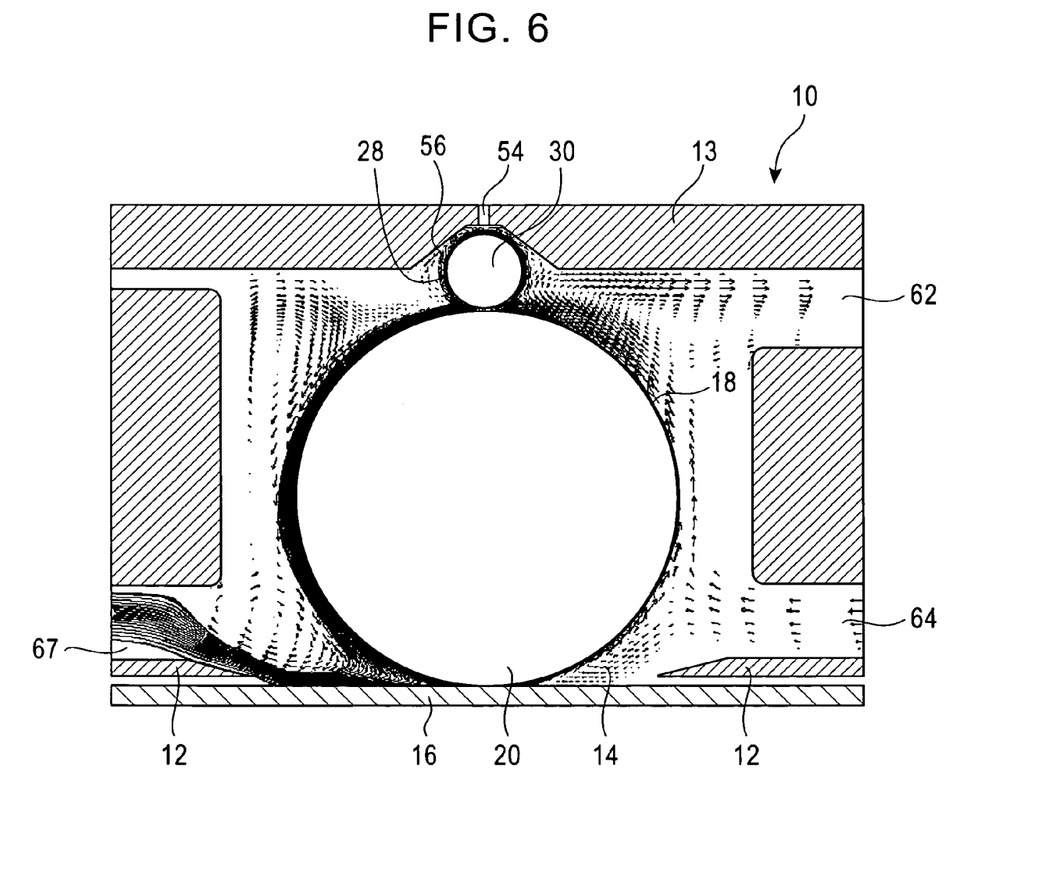
FIG. 6 is a drawing showing the entire configuration of a thin film forming apparatus according to another embodiment of the present invention.

In the present invention, the positional relation between the substrate 16 and the film-forming material supplying member 30 is not limited to that shown in the drawings. For example, even when the film-forming material supplying member 30 is disposed on the side of the rotor 20 apart from the substrate 16, as shown in FIG. 6, the film-forming particulates supplied from the film-forming material supplying member 30 can be transported to the surface of the substrate 16 by rotation of the rotor 20 and the carrier gas flow accompanying the rotation.

EXAMPLE

Figure 7:
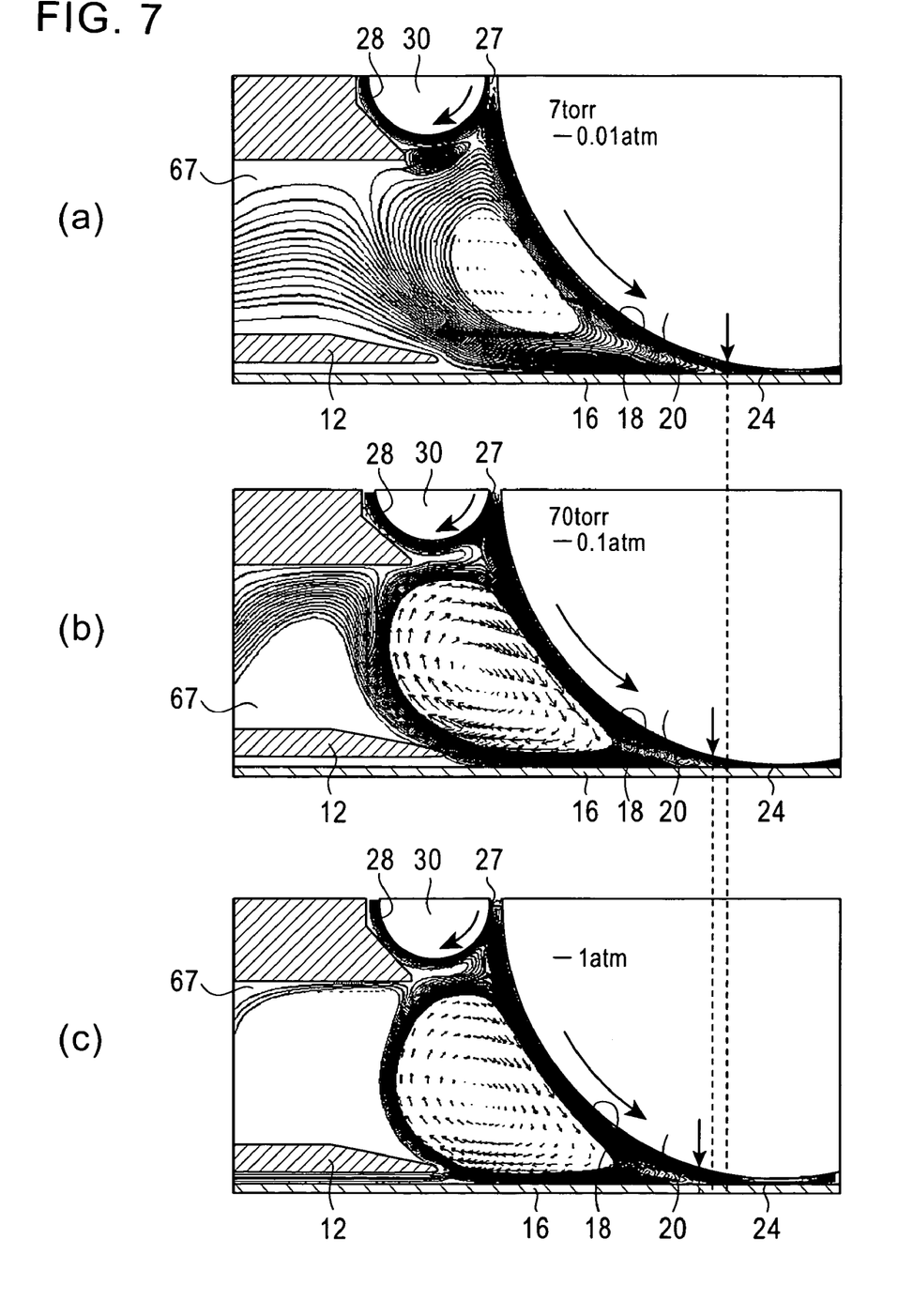
FIGS. 7(a), 7(b), and 7(c) are drawings showing relations between the pressure in a reactor and the gas flow and the position of a stagnation point in the thin film forming apparatus.

FIGS. 7(*a*), (*b*), and (*c*) show the analysis results of a fluid under pressures greatly changing from 100 Pa (7 Torr) to 100,000 Pa (1 atm). In these figures, the global behavior of flow lines is slightly changed by the balance between the diffusion coefficient and coefficient of kinetic viscosity of a carrier gas. However, only a stagnation point (shown by a downward arrow in the drawings) is slightly moved to the upstream side (to the left in the drawings) with substantially no change in the behavior of the flow lines. Therefore, it can be understood that in the present invention, a stable effect can be obtained over a wide pressure region.

Figure 8:
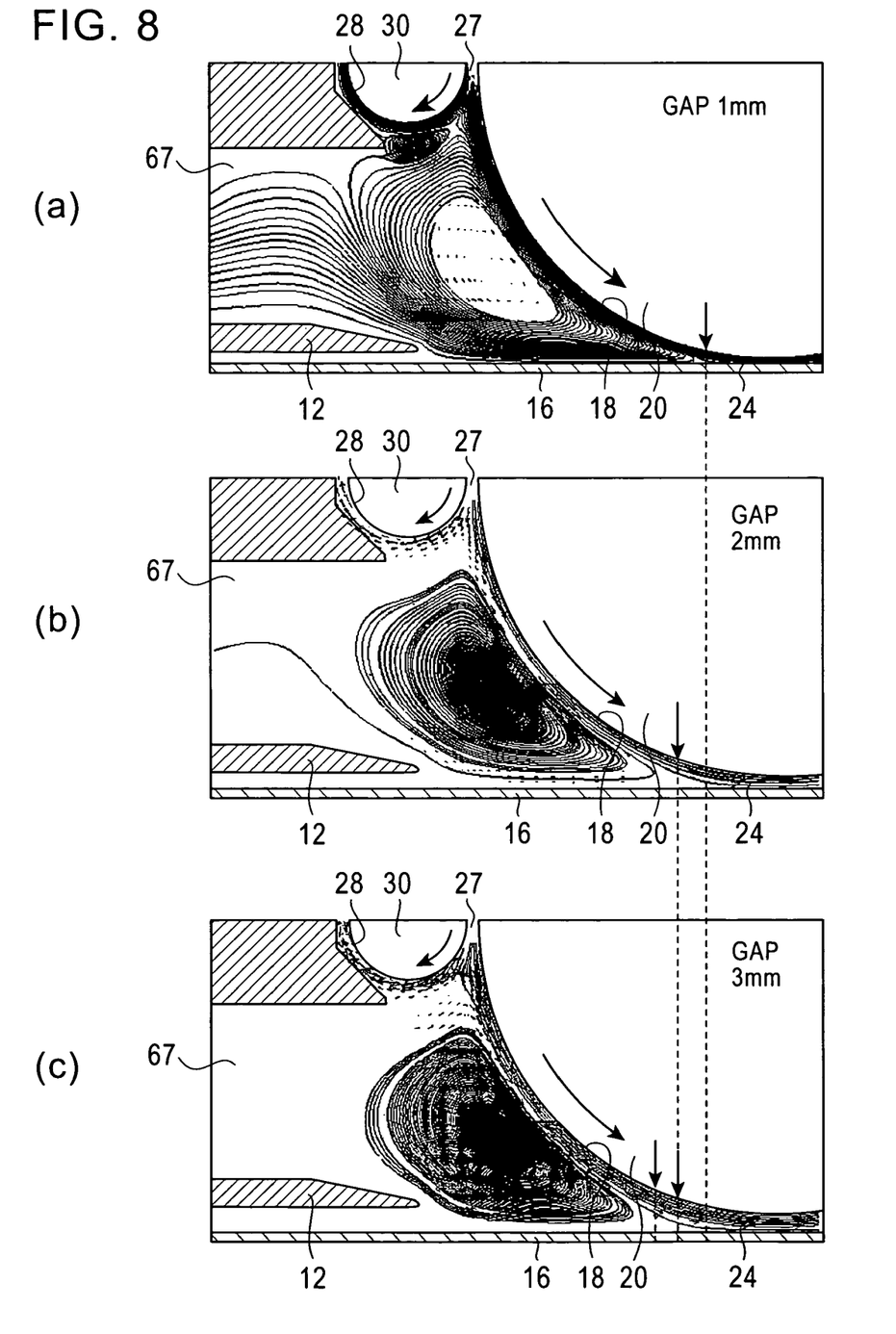
FIGS. 8(a), 8(b), and 8(c) are drawings showing relations between the gap dimension between the substrate surface and the rotor and the gas flow and the position of a stagnation point in the thin film forming apparatus.

FIGS. 8(*a*), (*b*) and (*c*) show the analysis result of a fluid with the dimension of the gap 27 between the rotor 20 and the film-forming material supplying member 30 being fixed at 2 mm, and the dimension of the gap 24 between the rotor 20 and the substrate 16 being set to each of ½ (1 mm), equivalent to (2 mm), and 1.5 times (3 mm) the dimension of the gap 27. As shown in the figures, when the gap 24 is 1 mm, the stagnation point (shown by a downward arrow in the figures) is near a position with the minimum dimension, and the flow lines containing the film-forming particulates mostly turn in front of the stagnation point, and flow back along the surface of the substrate. Most of the flow is discharged from the exhaust port 67, and a part of the flow forms an eddy. On the other hand, when the gap 24 is 2 mm or 3 mm, the stagnation point moves greatly to the upstream side, and most of the film-forming particulates pass through the gap 24. Therefore, in this case, it is not expected that a sufficient centrifugal force is excited on the film-forming particulates. Also, only the flow lines of an eddy produced on the upstream side of the rotor 20 are brought near to the stagnation point. The film-forming particulates leaking from the flow lines staying near the surface of the rotor 20 in a diffusive manner or stochastic transportation manner are trapped in the eddy, repeatedly turned in the eddy, and then settle at the stagnation point.

Therefore, in the present invention, in order to realize the formation of a satisfactory thin film, it is effective to keep the gap 24 between the rotor 20 and the substrate 16 down.

Specifically, the gap 24 is preferably smaller than the gap 27 between the rotor 20 and the film-forming material supplying member 30.

What is claimed is:

1. An apparatus for forming a thin film on a substrate, the apparatus comprising:

a treatment vessel into which a carrier gas is introduced;

a rotor disposed in the treatment vessel and having a cylindrical peripheral surface which faces a surface of a substrate, said rotor having a cylindrical peripheral surface;

said substrate having a portion proximate to said cylindrical peripheral surface and configured such that a first gap is present between said cylindrical peripheral surface and said substrate;

a stagnation point P adjacent to a portion of the substrate and adjacent to a portion of the cylindrical peripheral surface;

a rotor driving means for rotating the rotor around a central axis of said rotor;

a film-forming material supplying member disposed in the treatment vessel and having a portion proximate to said cylindrical peripheral surface of said rotor and configured such that a second gap is present between said film-forming material supplying member and said cylindrical peripheral surface, said film-forming material supplying member facing said cylindrical peripheral surface of said rotor at a position circumferentially apart from the position where the substrate faces said cylindrical peripheral surface, said film-forming material supplying member adapted to supply a film-forming material to the second gap which is present between said film-forming material supplying member and said cylindrical peripheral surface; and a film-forming material supplying means adapted for evaporating, vaporizing, or scattering the film-forming material of the film-forming material supplying member to supply the film-forming material to the cylindrical peripheral surface of the rotor;

wherein the atomic molecules of the film-forming material and the cluster particulates thereof, which are supplied to the cylindrical peripheral surface of the rotor at the second gap between the rotor and the film-forming material supplying member, are transported by a flow of the carrier gas including plasma created by the rotor to said stagnation point P located near a position with a minimum dimension of the first gap, said first gap having said stagnation point P adapted to adhere said atomic molecules of the film-forming material and the cluster particulates thereof to the surface of the substrate to form a thin film composed of the film-forming material on the surface of the substrate, and wherein a high-frequency power supply is disposed and electrically connected between the rotor and the film-forming material supplying member, and the high-frequency power supply alternates both the rotor and the film-forming material supplying member as an cathode and a corresponding anode which form an electric field in the second gap between the rotor and the film-forming material supplying member to generate the plasma of the carrier gas.

2. The apparatus for forming a thin film according to claim 1, wherein the film-forming material supplying means comprises heating means for heating the surface of the film-forming material supplying member to evaporate or vaporize the film-forming material in the surface.

3. The apparatus for forming a thin film according to claim 2, wherein the heating means is incorporated into the film-forming material supplying member at a position directly inside of the surface composed of the film-forming material.

4. The apparatus for forming a thin film according to claim 1, wherein a plasma generating means generates the plasma of the carrier gas in the reactor by forming a DC electric field, a high-frequency electric field, or an AC electric field other than a high-frequency electric field between the film-forming material supplying member and the rotor, so that the film-forming material in the surface of the film-forming material supplying member is sputtered by ions contained in the plasma.

5. The apparatus for forming a thin film according to claim 4, further comprising a sputtering gas supplying part for introducing a rare gas element having a larger element number than that of the constituent element of the carrier gas into the gap between the film-forming material supplying member and the cylindrical peripheral surface of the rotor, wherein ions of the rare gas element supplied from the sputtering gas supplying part are produced in the plasma to sputter the surface material of the film-forming material supplying member with the ions.

6. The apparatus for forming a thin film according to claim 4, further comprising magnetic flux forming means for producing magnetic flux lines in the gap between the film-forming material supplying member and the rotor, and enclosing the plasma produced in the gap.

7. The apparatus for forming a thin film according to claim 6, further comprising a support member for supporting the film-forming material supplying member, and a magnet incorporated into the support member, for generating the magnetic flux lines.

8. The apparatus for forming a thin film according to claim 2, wherein the film-forming material supplying member has a cylindrical peripheral surface having a central axis parallel to the rotation central axis of the rotor, and supplying member driving means is provided for rotating the film-forming material supplying member in the direction opposite to the rotational direction of the rotor.

9. The apparatus for forming a thin film according to claim 2, wherein the gap between the substrate surface and the peripheral surface of the rotor is smaller than the gap between the peripheral surface of the rotor and the film-forming material supplying member.

10. The apparatus for forming a thin film according to claim 2, further comprising a carrier gas circulating path for circulating the carrier gas in the reactor so that the carrier gas on the upstream side in the rotational direction of the rotor from the film-forming material supplying member is supplied from a downstream side in the rotational direction of the rotor from the position where the rotor faces the substrate.

11. The apparatus for forming a thin film according to claim 10, further comprising adsorption means provided at an intermediate position of the carrier gas circulating path, for removing, by adsorption, at least one gas contained in the carrier gas flowing through the carrier gas circulating path.

12. The apparatus for forming a thin film according to claim 1, wherein a reactor comprises an exhaust part for exhausting, to the outside of the reactor, the atomic molecules of the film-forming material and the cluster particulates thereof which remain unadhered to the surface of the substrate on an upstream side in the rotational direction of the rotor from the position where the rotor faces the substrate.

13. The apparatus for forming a thin film according to claim 2, wherein the cylindrical peripheral surface of the film-forming material supplying member has a diameter smaller than a diameter of the cylindrical peripheral surface of the rotor.

14. The apparatus for forming a thin film according to claim 1, wherein the carrier gas flowing out of the second gap flows along the circumference of the rotor, turns in front of the stagnation point P, and then flows along the surface of the substrate.

15. The apparatus for forming a thin film according to claim 14, wherein a half of the carrier gas flowing along the surface of the substrate forms an eddy, and the remaining half of the carrier gas is exhausted outside of the treatment vessel.

16. The apparatus for forming a thin film according to claim 10, further comprising adsorption means provided at an intermediate position of the carrier gas circulating path, for removing, by adsorption, at least an impurity gas discharged from the inner wall of the reactor contained in the carrier gas flowing through the carrier gas circulating path.

17. The apparatus for forming a thin film according to claim 10, further comprising adsorption means provided at an intermediate position of the carrier gas circulating path, for removing, by adsorption, at least a sputtering gas remaining in the reactor contained in the carrier gas flowing through the carrier gas circulating path.

18. The apparatus for forming a thin film according to claim 10, further comprising adsorption means provided at an intermediate position of the carrier gas circulating path, for removing, by adsorption, at least a secondary unnecessary organic gas vaporized from the film-forming material contained in the carrier gas flowing through the carrier gas circulating path.

* * * * *